(12) United States Patent
Sasaki et al.

(10) Patent No.: US 9,425,056 B2
(45) Date of Patent: Aug. 23, 2016

(54) METHOD FOR PRODUCING SILICON WAFER

(75) Inventors: Takuya Sasaki, Nishishirakawa (JP); Hiromasa Hashimoto, Nishishirakawa (JP); Kazuya Sato, Nishishirakawa (JP); Ayumu Sato, Jyoetsu (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 13/983,964

(22) PCT Filed: Feb. 9, 2012

(86) PCT No.: PCT/JP2012/000856
§ 371 (c)(1),
(2), (4) Date: Aug. 6, 2013

(87) PCT Pub. No.: WO2012/120785
PCT Pub. Date: Sep. 13, 2012

(65) Prior Publication Data
US 2013/0316521 A1   Nov. 28, 2013

(30) Foreign Application Priority Data
Mar. 7, 2011 (JP) ................. 2011-048852

(51) Int. Cl.
H01L 21/302 (2006.01)
B24B 1/00 (2006.01)
B24B 37/08 (2012.01)
H01L 21/304 (2006.01)
B24B 37/24 (2012.01)
H01L 21/02 (2006.01)

(52) U.S. Cl.
CPC .............. *H01L 21/304* (2013.01); *B24B 37/08* (2013.01); *B24B 37/24* (2013.01); *H01L 21/02024* (2013.01)

(58) Field of Classification Search
None
See application file for complete search history.

(56) References Cited

U.S. PATENT DOCUMENTS

| | | | |
|---|---|---|---|
| 5,643,405 | A | 7/1997 | Bello et al. |
| 5,914,053 | A | 6/1999 | Masumura et al. |
| 7,507,146 | B2 | 3/2009 | Kato et al. |
| 2001/0039119 | A1 | 11/2001 | Kishimoto |
| 2002/0098438 | A1* | 7/2002 | Hashizume et al. .......... 430/124 |
| 2003/0104698 | A1 | 6/2003 | Taniguchi et al. |
| 2003/0181141 | A1* | 9/2003 | Taniguchi .............. B24B 37/042 451/36 |

(Continued)

FOREIGN PATENT DOCUMENTS

| | | |
|---|---|---|
| CN | 101106082 A | 1/2008 |
| CN | 101722447 A | 6/2010 |

(Continued)

OTHER PUBLICATIONS

English translation of JP-2004356336.*

(Continued)

*Primary Examiner* — Pamela E Perkins
(74) *Attorney, Agent, or Firm* — Oliff PLC

(57) ABSTRACT

The present invention provides a method for producing a silicon wafer including a step of, after growing the oxide film on one surface of a raw material silicon wafer by chemical-vapor deposition, performing double-side polishing of the raw material silicon wafer in such a manner that a suede polishing pad or a velour polishing pad with an asker-C rubber hardness of 50° or more but less than 90° is used for the oxide-film surface.

8 Claims, 4 Drawing Sheets

(56) References Cited

U.S. PATENT DOCUMENTS

| | | |
|---|---|---|
| 2005/0064709 A1 | 3/2005 | Shimomura et al. |
| 2008/0014839 A1 | 1/2008 | Pietsch et al. |
| 2010/0009605 A1 | 1/2010 | Taniguchi et al. |
| 2010/0099337 A1 | 4/2010 | Kerstan et al. |
| 2011/0195638 A1* | 8/2011 | Sasaki et al. ............. 451/36 |
| 2011/0299887 A1* | 12/2011 | Miyaji et al. ............. 399/159 |
| 2013/0071964 A1* | 3/2013 | Kato et al. ............. 438/50 |

FOREIGN PATENT DOCUMENTS

| | | |
|---|---|---|
| EP | 1 900 858 A1 | 3/2008 |
| JP | A-09-045644 | 2/1997 |
| JP | A-09-199465 | 7/1997 |
| JP | A-2000-150433 | 5/2000 |
| JP | A-2001-113459 | 4/2001 |
| JP | A-2001-232561 | 8/2001 |
| JP | A-2004-356336 | 12/2004 |
| JP | A-2005-005315 | 1/2005 |
| TW | 494487 B | 7/2002 |
| WO | 2006/070556 A1 | 7/2006 |

OTHER PUBLICATIONS

International Search Report issued in International Application No. PCT/JP2012/000856 dated Apr. 3, 2012.

Jan. 8, 2015 Taiwan Search Report issued in Taiwan Application No. 101104932.

Apr. 30, 2015 Office Action issued in Chinese Application No. 201280012012.5.

Dec. 30, 2015 Search Report issued in Chinese Application No. 2012800120125.

* cited by examiner

METHOD FOR PRODUCING SILICON WAFER

TECHNICAL FIELD

The present invention relates to a method for producing a silicon wafer, for use in production of an epitaxial silicon wafer, having a mirror-polished surface on one surface and a dopant volatilization preventive film on the other surface.

BACKGROUND ART

As a wafer from which a discrete semiconductor, a bipolar IC, and so forth are produced, a semiconductor epitaxial wafer has been widely used because of its excellent characteristics. Moreover, for a MOS LSI, the semiconductor epitaxial wafer has also been widely used in a microprocessor unit and a flash memory device because of its excellent soft-error and latch-up characteristics.

Such a semiconductor epitaxial wafer is produced in the following manner, for example.

First, a single crystal ingot is produced generally by the Czochralski (CZ) method or the floating zone (FZ) method. The produced single crystal ingot is cut into blocks, and subjected to a rounding process (a cylindrical grinding process) to make its diameter uniform. The single crystal ingot block is sliced into a plurality of wafers (a slicing process), and a chamfering process (a beveling process) is performed on the wafer to remove the corner on its periphery. On the wafer, a mechanical grinding process (a lapping process) is then performed to remove its surface irregularities, improve its flatness, and minimize machining strain produced in the slicing process. Then, a machining strain layer formed in a surface layer of the wafer in the mechanical grinding process is removed, for example, by mixed acid etching (an etching process).

Next, a protective film for preventing automatic doping (a dopant volatilization preventive film) is formed at least on the back surface of the wafer. A mirror polishing process is then performed to polish the front surface of the semiconductor wafer into a mirror-polished surface by chemical and mechanical polishing (CMP), and on the mirror-polished surface, an epitaxial film is formed; through these processes, a semiconductor epitaxial wafer is produced.

Here, an additional explanation of automatic doping is provided. In an epitaxial process of growing a single crystal thin film (an epitaxial film) on a wafer by chemical-vapor deposition, the wafer is generally exposed to a high temperature of about 1000 to 1200° C. At this time, an automatic doping phenomenon occurs, a phenomenon in which dopant contained in the wafer is volatilized and taken into the epitaxial film during the process of forming the epitaxial film.

In particular, in production of a semiconductor epitaxial wafer for a power MOS, a low resistivity wafer whose conductivity type is P-type or N-type, heavily doped with impurities, has been used as a substrate for forming an epitaxial film; in this case, the occurrence of automatic doping becomes remarkable.

That is, when such a heavily-doped wafer is heated, an automatic doping phenomenon in which impurities such as boron, phosphorus, antimony, and arsenic with which the wafer is doped escape from the wafer and enter the epitaxial film occurs in a wafer without a dopant volatilization preventive film, which makes it impossible to obtain an epitaxial film having a desired resistivity. As a result, the electrical characteristics of the semiconductor epitaxial wafer change, and a semiconductor device fabricated by using this semiconductor epitaxial wafer does not exhibit characteristics as designed and becomes a failure.

Therefore, as described earlier, to prevent automatic doping, a dopant volatilization preventive film on the back surface of a wafer is needed. Since high flatness is particularly required in a large-diameter wafer such as a 300-mm-diameter wafer, after double-side polishing is performed to planarize the wafer, an oxide film as a dopant volatilization preventive film is formed on the back surface of the wafer by chemical-vapor deposition (CVD).

Then, in the above-described mirror polishing process, the front surface side of the silicon wafer, that is, the side on which an epitaxial film is to be grown by chemical-vapor deposition is mirror-polished by single-side polishing. In the single-side polishing, since strain is produced in the silicon surface in a process of forming an oxide film by CVD, the mirror-polished surface needs to be finished by polishing the silicon front surface side at least up to several micrometers to remove the strain.

However, there arises a problem that the wafer flatness is degraded by single-side polishing with a stock removal required to remove the strain produced in the oxide film formation process by CVD. In recent years, there is a necessity to improve the degraded flatness of the wafer to meet an increasing need for a wafer with higher flatness.

Here, Patent Document 1 discloses a method for producing a semiconductor wafer, enabling a highly flat wafer having a mirror-polished surface and a rough surface to be produced by polishing with a double-side polishing apparatus a wafer on which an oxide film is grown on one surface by CVD.

CITATION LIST

Patent Literature

Patent Document 1: Japanese Unexamined Patent Application Publication (Kokai) No. H9-199465

SUMMARY OF INVENTION

Technical Problem

This method, however, aims merely at producing a highly flat wafer having a rough surface, and removes the oxide film by the double-side polishing. Moreover, even when the thickness of the oxide film and the stock removal at the time of double-side polishing are adjusted to leave the oxide film in this method, the oxide film is thinned by polishing or a scratch is generated on the oxide-film surface; thus there arises a problem in that the oxide film lacks its quality to serve as a dopant volatilization preventive film.

The present invention has been made in view of the problems described above and an object thereof is to provide a method that can produce a silicon wafer with high flatness and maintain the quality of an oxide film as a dopant volatilization preventive film by suppressing a scratch and a polishing amount of the oxide film.

Solution to Problem

To attain the above-described object, the present invention provides a method for producing a silicon wafer with a mirror-polished surface and an oxide-film surface by growing an oxide film on one surface of a raw material silicon wafer by chemical-vapor deposition and then polishing a surface of the raw material silicon wafer on a side on which the oxide film is not grown, the method comprising a step of, after growing the oxide film, performing double-side polishing of the raw material silicon wafer in such a manner to use for the oxide-film surface a suede polishing pad, obtained by wet coagulating and foaming urethane resin after the urethane resin is applied, with an asker-C rubber hardness of 50° or more but less than 90°, or a velour polishing pad, obtained by impregnating a nonwoven fabric with urethane resin, with an asker-C rubber hardness of 50° or more but less than 90°, and to use for the surface to be polished on the side on which the oxide film is not grown an urethane closed-cell foam polishing pad or a velour polishing pad, obtained by impregnating a nonwoven fabric with urethane resin, with an asker-C rubber hardness of 90° or more.

With such a production method, in double-side polishing, the oxide film can be suppressed from scratching without being excessively polished and the silicon wafer can be polished highly flat; a silicon wafer with high flatness in which the quality of an oxide film as a dopant volatilization preventive film is maintained can be produced.

At this time, after the step of performing double-side polishing, the mirror-polished surface may be polished by using a single-side polishing apparatus.

In this manner, it is possible to further improve the flatness of the silicon wafer and finish the mirror-polished surface with high precision.

Moreover, at this time, as the raw material silicon wafer, a silicon wafer with a resistivity of 0.1 Ω·cm or less may be used.

Even when such a low resistivity silicon wafer, which tends to cause automatic doping later in an epitaxial wafer process, is used, the present invention enables production of a silicon wafer that can suppress a scratch on the oxide film for serving as a dopant volatilization preventive film and surely prevent automatic doping.

Furthermore, at this time, the asker-C rubber hardness of the polishing pad used for the oxide-film surface is preferably 50° or more but 70° or less.

In this manner, it is possible more surely to suppress a scratch on the oxide film and to polish the silicon wafer highly flat.

Advantageous Effects of Invention

In the present invention, after growing an oxide film on one surface of a raw material silicon wafer by chemical-vapor deposition, double-side polishing of the raw material silicon wafer is performed in such a manner to use for the oxide-film surface a suede polishing pad, obtained by wet coagulating and foaming urethane resin after the urethane resin is applied, or a velour polishing pad, obtained by impregnating a nonwoven fabric with urethane resin, with an asker-C rubber hardness of 50° or more but less than 90°, and to use for the surface to be polished on the side on which the oxide film is not grown an urethane closed-cell foam polishing pad or a velour polishing pad, obtained by impregnating a nonwoven fabric with urethane resin, with an asker-C rubber hardness of 90° or more; therefore, in double-side polishing, the oxide film can be suppressed from scratching without being excessively polished and the silicon wafer can be polished highly flat; a silicon wafer with high flatness in which the quality of an oxide film for serving as a dopant volatilization preventive film is maintained can be produced.

DESCRIPTION OF EMBODIMENTS

Hereinafter, an embodiment of the present invention will be described, but the present invention is not limited thereto.

In general, on the back surface of a silicon wafer for use in production of a semiconductor epitaxial wafer, an oxide film as a dopant volatilization preventive film is formed to prevent automatic doping. This oxide film is formed by CVD, but, the CVD produces strain in a silicon surface. To remove this strain, single-side polishing with a stock removal of several micrometers or more is needed in a process of finishing into a mirror-polished surface a surface on the side on which an epitaxial film is to be grown by chemical-vapor deposition. However, the single-side polishing with such a stock removal degrades the wafer's flatness.

Conventionally, a method for producing a semiconductor wafer, producing a highly flat wafer having a mirror surface and a rough surface by polishing with a double-side polishing apparatus a wafer on which an oxide film is grown on one surface by CVD, has been known. In this method, however, polishing thins the oxide film or generates a scratch on the oxide-film surface, making it impossible for the oxide film to function as a dopant volatilization preventive film.

As described above, with, it is difficult for the conventional method to produce a wafer with high flatness while maintaining the quality of an oxide film for preventing dopant volatilization.

Therefore, the inventors conducted intensive studies to solve such a problem. As a result, the inventors have found out the following: double-side polishing is performed to mirror-polish a surface on the side on which an epitaxial film is to be grown by chemical-vapor deposition; upper and lower polishing pads used in the double-side polishing are made of such material and have such hardness as defined in the present invention; in this way, a wafer with high flatness can be produced while the quality of an oxide film is maintained. The inventors thereby completed the present invention.

Figure 1:
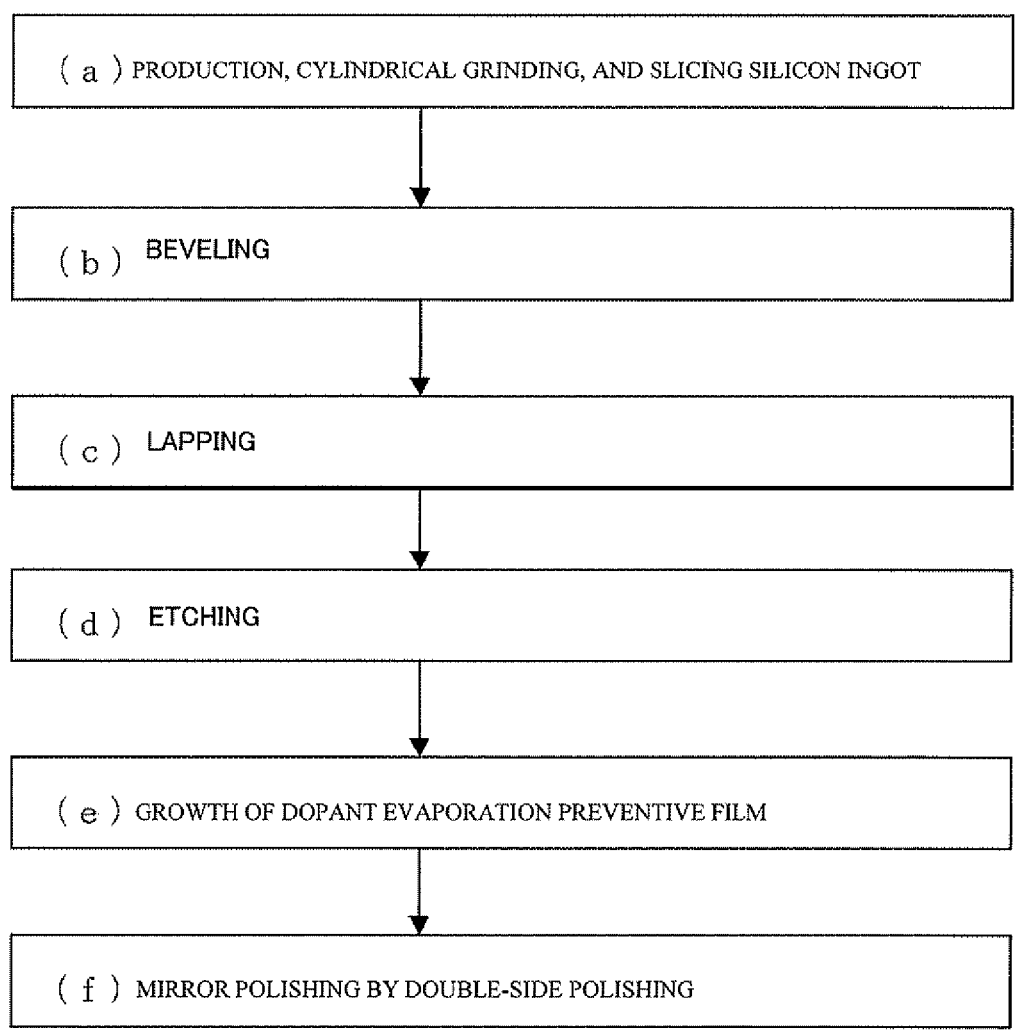
FIG. 1 is a flow diagram depicting an example of a method for producing a silicon wafer of the present invention.

FIG. 1 is a flow diagram depicting an example of a method for producing a silicon wafer of the present invention.

First, a raw material silicon wafer having one surface on which an oxide film for preventing dopant volatilization is formed is prepared in the following manner. Note the following: the processes performed before the growth of the oxide film are in principle the same as those of the conventional method; hereinafter, a surface of a raw material silicon wafer on the side on which an oxide film is to be formed is sometimes referred to as a back surface, and a surface on the side on which the oxide film is not formed but an epitaxial film is to be formed after mirror polishing is sometimes referred to as a front surface.

Specifically, a silicon ingot is produced by the CZ method, or the FZ method. Then, the produced silicon ingot is cut into blocks with a predetermined length, and subjected to a rounding process (a cylindrical grinding process) to make its diameter uniform. The silicon ingot is then sliced into wafers (See FIG. 1 at (a), a slicing process).

Next, a chamfering process (See FIG. 1 at (b), a beveling process) is performed on the sliced raw material silicon wafer to remove the corner on its periphery. On the wafer, a mechanical grinding process (See FIG. 1 at (c), a lapping process) is then performed to remove its surface irregularities, improve its flatness, and minimize machining strain produced in the slicing process, and a machining strain layer formed in a surface layer of the wafer in the mechanical grinding process is removed, for example, by mixed acid etching (See FIG. 1 at (d), an etching process).

Here, to further improve the flatness of the wafer, double-side polishing can be performed on the wafer, before the later-described process of growing a dopant volatilization prevention oxide film, for example, after the above-described etching process. Since higher flatness is particularly required when a large-diameter wafer such as a 300-mm-diameter wafer is produced, such double-side polishing is preferably performed. Here, a polishing pad that is used in this double-side polishing is not limited in particular; a conventional polishing pad may be used.

Next, an oxide film for preventing dopant volatilization is grown on the back surface of the raw material silicon wafer to prevent automatic doping (See FIG. 1 at (e), a dopant volatilization prevention oxide film growth process). The grown oxide film for preventing dopant volatilization can strongly prevent heavily-doped dopant in the wafer from being volatilized and taken into an epitaxial film, for example, in a process of forming epitaxial film or other heat treatment processes.

Here, as the oxide film for preventing dopant volatilization, a silicon oxide film can be formed. The silicon dioxide film can be easily formed by deposition in an atmospheric CVD method, or formation of a thermal oxide film by thermal oxidation and can be produced at low cost.

Moreover, an outer periphery of the oxide film for preventing dopant volatilization may be removed by an etching or a machining process.

Next, double-side polishing is performed on the raw material silicon wafer having the oxide film grown on the back surface to finish the front surface side into a mirror-polished surface (See FIG. 1 at (f), a mirror polishing process by double-side polishing). This double-side polishing is performed by using a double-side polishing apparatus depicted in FIG. 2, for example.

Figure 2:
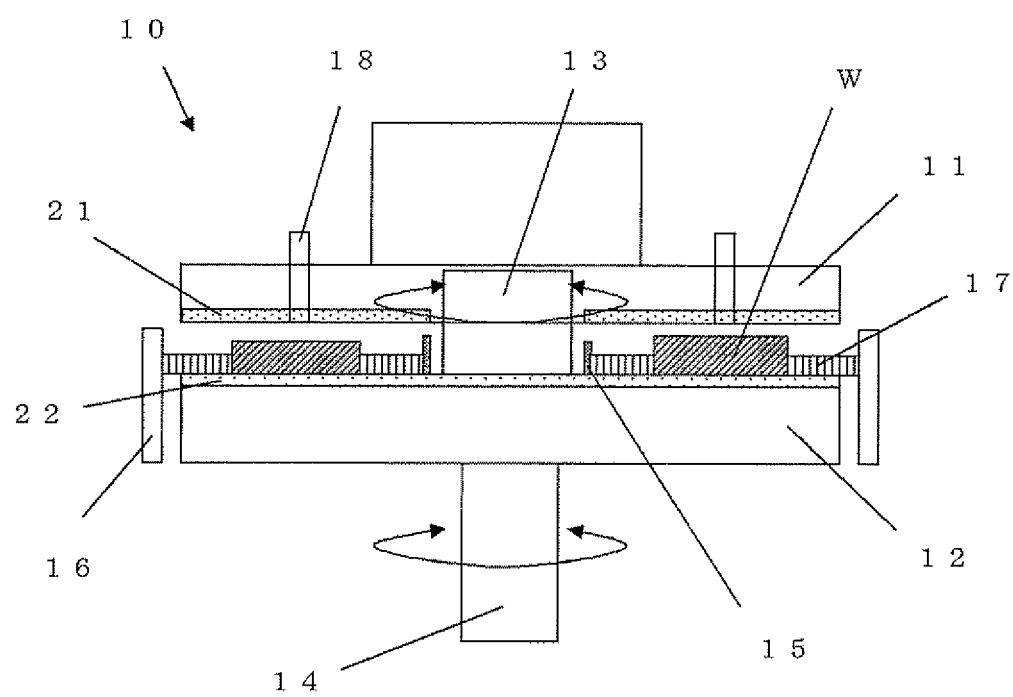
FIG. 2 is a schematic diagram depicting an example of a double-side polishing apparatus that can be used in the present invention.

As depicted in FIG. 2, the double-side polishing apparatus 10 includes an upper turn table 11 and a lower turn table 12 that are provided such that they face to one another. Polishing pads 21 and 22 are attached to the sides, facing to one another, of the upper and lower turn tables 11 and 12, respectively. The upper and lower turn tables 11 and 12 can each rotate in a direction opposite to one another by upper and lower turn table rotating shafts 13 and 14, respectively.

The lower turn table 12 has a sun gear 15 provided at its center and an annular internal gear 16 provided at its outer edge. Between an upper surface of the polishing pad 22 attached to the lower turn table 12 and a lower surface of the polishing pad 21 attached to the upper turn table 11, a carrier 17 having a holding hole for holding a wafer W is placed. Then, as a result of the carrier 17 rotating about its axis and revolving by the action of the sun gear 15 and the internal gear 16, the front and back surfaces of the wafer W held in the holding hole of the carrier 17 are rubbed and polished between the upper and lower polishing pads 21 and 22.

In the present invention, as the upper and lower polishing pads used at the time of the double-side polishing, the following polishing pads are used: a suede polishing pad, obtained by wet coagulating and foaming urethane resin after the urethane resin is applied, with an asker-C rubber hardness of 50° or more but less than 90°, more preferably 50° or more but less than 70°, or a velour polishing pad, obtained by impregnating a nonwoven fabric with urethane resin, with an asker-C rubber hardness of 50° or more but less than 90°, more preferably 50° or more but less than 70°, is used for the side on which the oxide film is formed (for the oxide-film surface); an urethane closed-cell foam polishing pad or a velour polishing pad, obtained by impregnating a nonwoven fabric with urethane resin, with an asker-C rubber hardness of 90° or more is used for the surface to be polished on the side on which the oxide film is not grown (the surface to be mirror-polished).

Then, the raw material silicon wafer W is polished by rotating and revolving the carrier 17 holding the raw material silicon wafer W while a polishing agent is supplied from a plurality of polishing agent feeding openings 18 disposed in the upper turn table 11, and the upper and lower turn tables 11 and 12 are rotated and presses the wafer.

As described above, when the suede polishing pad or the velour polishing pad with an asker-C rubber hardness of 50° or more but less than 90° is used for the oxide-film surface, the oxide film can be suppressed more surely from being polished and effectively from generating a scratch. That is, it is possible to surely ensure the quality of the oxide film as a dopant volatilization preventive film for preventing automatic doping in a subsequent epitaxial process. Moreover, when the polishing pad with an asker-C rubber hardness of 50° or more is used, an adverse effect on the wafer flatness due to an excessively soft polishing pad can be surely avoided.

Furthermore, when an urethane closed-cell foam polishing pad or a velour based polishing pad, obtained by impregnating a nonwoven fabric with urethane resin, with an asker-C rubber hardness of 90° or more is used for the surface to be mirror-polished in combination with the above-described polishing pad for the oxide-film surface, a silicon wafer with high flatness, having a mirror-polished front surface, can be obtained. Here, an upper limit to the hardness of the polishing pad used for the surface to be mirror-polished is not limited particularly; currently, a polishing pad with a hardness of up to about 95° is available.

Incidentally, a polishing agent to be used is not limited particularly; for example, colloidal silica or fumed silica may be used.

At this time, after a process of performing double-side polishing, the surface to be mirror-polished of the wafer can be further polished by using a single-side polishing apparatus.

In this manner, it is possible to finish the mirror-polished surface of the wafer with high precision and further improve the flatness of the silicon wafer. In the present invention, since the strain of the silicon surface due to CVD has been already removed by the above-described double-side polishing, a large stock removal is unnecessary in this single-side polishing; therefore the single-side polishing does not degrade the wafer's flatness.

Here, as the raw material silicon wafer, a silicon wafer with a resistivity of 0.1 Ω·cm or less can be used.

Conventionally, automatic doping in an epitaxial process tends to occur remarkably when a low resistivity wafer heavily-doped with impurities is used. In the present invention, however, even when such a low resistivity silicon wafer is used, it is possible to produce a silicon wafer with high flatness, having a dopant volatilization preventive oxide film that can surely prevent automatic doping.

EXAMPLE

Hereinafter, the present invention will be described more specifically with examples and comparative examples of the present invention, but the present invention is not limited to these examples.

Examples 1-5

A silicon single crystal wafer was produced by the method for producing a silicon wafer of the present invention, depicted in FIG. 1, and the incidence of scratches on the oxide-film surface was evaluated.

First, a silicon single crystal ingot was grew up by the CZ method and was sliced to prepare 600 raw material silicon single crystal wafers having a diameter of 300 mm, crystal orientation <100>, and a conductivity type of P-type. The edge portions of these wafers were chamfered, lapping was performed, and etching was performed to remove residual strain produced by the lapping. Then, both surfaces were mirror-polished to make the wafers highly flat, and the edge portions were chamfered into mirror-polished portions to reduce particles from the edge portions.

Next, a 4000-angstrom oxide film was grown on the back surface of the raw material silicon single crystal wafer by CVD, and a part of the oxide film on the edge portion was removed by etching.

Then, with the double-side polishing apparatus depicted in FIG. 2, double-side polishing was performed while the raw material silicon single crystal wafer was held such that the oxide-film surface faced downward. In the double-polishing, an urethane closed-cell foam polishing pad with an asker-C rubber hardness of 90° was used for the side to be mirror-polished, that is, the surface to be polished on the side on which the oxide film was not grown (the upper side); a suede polishing pad was used for the oxide-film surface (the lower side), and the suede polishing pad had the following hardness: an asker-C rubber hardness of 85° (Example 1), an asker-C rubber hardness of 80° (Example 2), an asker-C rubber hardness of 70° (Example 3), an asker-C rubber hardness of 65° (Example 4), and an asker-C rubber hardness of 50° (Example 5). The double-side polishing was performed each on 100 wafers among the above-described raw material silicon single crystal wafers.

The following are double-side polishing conditions. Incidentally, the stock removal was a value for the silicon single crystal surface on the side to be mirror-polished and was set at 4 μm to remove the strain produced in the silicon single crystal surface in the process of forming the oxide film by CVD. Moreover, the polishing time was set at 40 minutes because investigation, conducted in advance, showed that the polishing rate of the silicon single crystal surface was 0.1 μm/min in all examples under the following polishing conditions.

Raw material wafer: P-type, crystal orientation <100>, 300 mm in diameter
Upper polishing pad: urethane closed-cell foam, an asker-C rubber hardness of 90°
Lower polishing pad: a suede polishing pad, an asker-C rubber hardness of 85° to 50°
Polishing agent: a colloidal silica polishing agent
Polishing load: 100 g/cm$^2$
Polishing time: 40 minutes
Stock removal: 4 μm After the double-side polishing, the mirror-polished surface of the silicon single crystal wafer was finished with a stock removal of 1 μm by using the single-side polishing apparatus.

Then, the incidence of scratches on the oxide film of the silicon single crystal wafer was evaluated by visually checking the presence or absence of a scratch under a fluorescent light.

Figure 3:
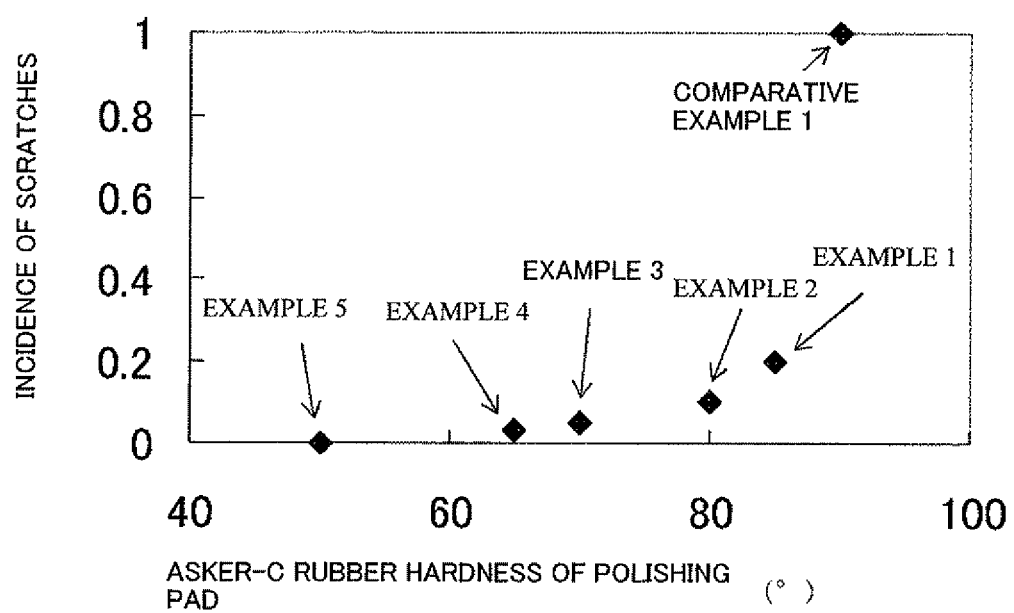
FIG. 3 is a diagram depicting the results of scratches on oxide films of Examples 1 to 5 and Comparative Example 1.

The results are depicted in FIG. 3. Here, the incidence of scratches in FIG. 3 represents values with respect to when the incidence of scratches in the later-described Comparative Example 1 is defined as '1'. As depicted in FIG. 3, there is a correlation between the hardness of a polishing pad and the incidence of scratches: the lower the hardness of a polishing pad, the smaller the number of scratches. In addition, scratches are greatly suppressed in comparison with the result of Comparative Example 1; in particular when the asker-C rubber hardness is 70° or less, scratches are reduced to ⅟₁₀ or less of those of Comparative Example 1.

Moreover, evaluation of decrease in oxide film thickness revealed that, in all examples, the oxide films decreased in thickness by about 30 nm and were hardly polished.

As described above, it was confirmed that the method for producing a silicon wafer of the invention can produce a silicon wafer with high flatness and maintain the quality of an oxide film as a dopant volatilization preventive film by suppressing a scratch and a polishing amount of the oxide film.

Example 6

Under conditions similar to those of Example 3 (the asker-C rubber hardness of a lower polishing pad was 70°) except that the asker-C hardness of a polishing pad for the side to be mirror-polished (the upper side) was set at 95°, 300 silicon single crystal wafers were produced, and the flatness thereof were evaluated.

Incidentally, as the flatness, an SFQR (MAX) was measured by an AFS apparatus manufactured by ADE Corporation in conditions of a site size of 26 mm×8 mm with the edge exclusion of 2 mm.

Figure 4:
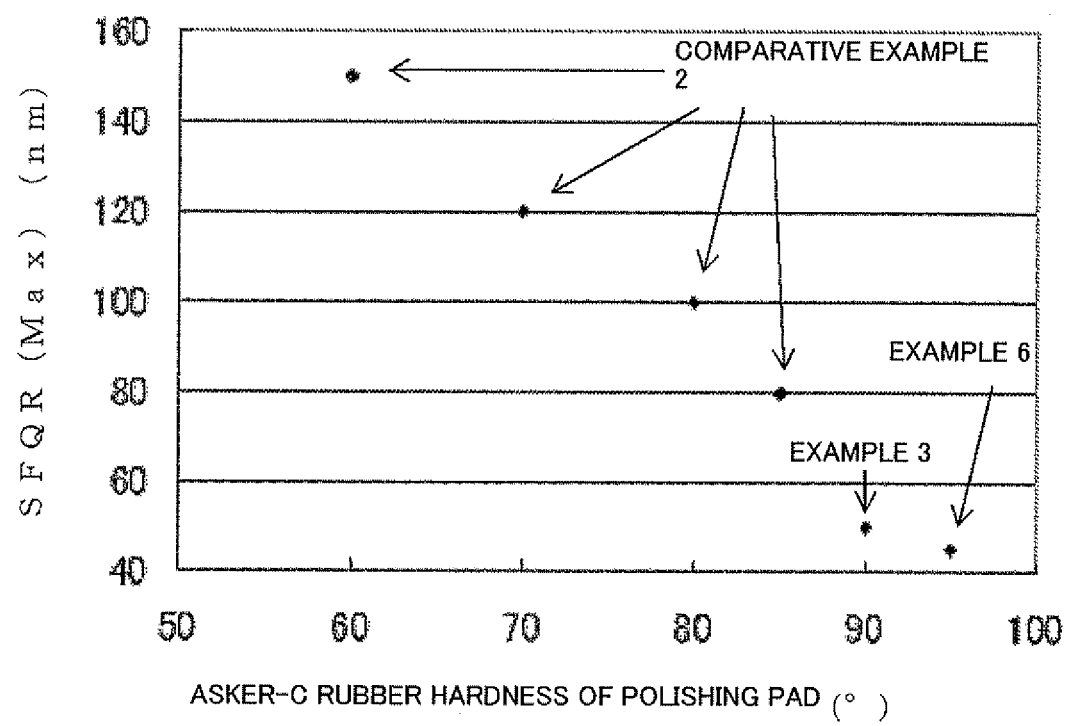
FIG. 4 is a diagram depicting the results of the flatness of Example 6 and Comparative Example 2.

The result is depicted in FIG. 4 with the value obtained in Example 3. As depicted in FIG. 4, when the asker-C rubber hardness was 90° (Example 3), the mean SFQR (MAX) was 50 nm in average, and, when the asker-C rubber hardness was 95° (Example 6), the mean SFQR (MAX) was 45 nmin average, which indicated higher flatness and a great improvement as compared to the results of the later-described Comparative Examples 2 and 3.

As described above, it was confirmed that the method for producing a silicon wafer of the present invention can produce a silicon wafer with high flatness.

Comparative Example 1

Silicon single crystal wafers were produced under conditions similar to those of Example 1 except that the asker-C rubber hardness of a suede polishing pad used for the oxide-film surface was set at 90°, and evaluations were made as with Example 1.

The result is depicted in FIG. 3. As depicted in FIG. 3, the incidence of scratches was much higher than those of all examples.

Comparative Example 2

Under conditions similar to those of Example 6 except that the asker-C rubber hardness of a polishing pad for the side to be mirror-polished (the upper side) was set at 60°, 70°, 80°, and 85°, 300 silicon single crystal wafers were produced, and the flatness thereof were evaluated.

The results are depicted in FIG. 4. As depicted in FIG. 4, the mean SFQR (MAX) value was much greater than the result of Example 6.

From this, it was confirmed that the asker-C hardness of a polishing pad used for the side to be mirror-polished needs to be 90° or more.

Comparative Example 3

The process to the formation of an oxide film on the back surface of a silicon single crystal wafer by CVD and the removal of the oxide film in an edge portion was performed under conditions similar to those of examples, the surface of the silicon single crystal wafer on the side on which mirror polishing was to be performed, the surface on which the oxide film was not grown, was then mirror-polished by using the single-side polishing apparatus without double-side polishing of the present invention, and evaluations were made in a manner similar to that of Example 6. Incidentally, a stock removal was set at 5 μm to remove the strain produced in the single crystal silicon surface in the process of forming the oxide film by CVD.

Here, the following are polishing conditions.

Raw material wafer: P-type, crystal orientation <100>, 300 mm in diameter
Polishing head: vacuum suction type
Polishing pad: urethane closed-cell foam, an asker-C hardness of 90°
Polishing agent: a colloidal silica polishing agent
Polishing load: 250 g/cm$^2$
Polishing time: 6 minutes
Stock removal: 5 μm According to the result, the mean SFQR (MAX) was 100 nm and was greater than that of Example 6.

As described above, when a silicon single crystal wafer is mirror-polished by using the single-side polishing apparatus with a stock removal required to remove the strain produced in the above-described process of forming the oxide film by CVD, the wafer's flatness is degraded; it is impossible to produce a silicon wafer with desired high flatness.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for producing a silicon wafer with a mirror-polished surface and an oxide-film surface by growing an oxide film on one surface of a raw material silicon wafer by chemical-vapor deposition and then polishing a surface of the raw material silicon wafer on a side on which the oxide film is not grown, the method comprising a step of
after growing the oxide film, performing double-side polishing of the raw material silicon wafer in such a manner that a suede polishing pad or a velour polishing pad with an asker-C rubber hardness of 50° or more but less than 90° is used for the oxide-film surface, the suede polishing pad being obtained by wet coagulating and foaming urethane resin after the urethane resin is applied, the velour polishing pad being obtained by impregnating a nonwoven fabric with urethane resin, and an urethane closed-cell foam polishing pad or a velour polishing pad with an asker-C rubber hardness of 90° or more is used for the surface to be polished on the side on which the oxide film is not grown, the urethane closed-cell foam polishing pad or the velour polishing pad being obtained by impregnating a non-woven fabric with urethane resin.

2. The method for producing a silicon wafer according to claim 1, wherein
after the step of performing double-side polishing, the mirror-polished surface is polished by using a single-side polishing apparatus.

3. The method for producing a silicon wafer according to claim 2, wherein
the asker-C rubber hardness of the polishing pad used for the oxide-film surface is 50° or more but 70° or less.

4. The method for producing a silicon wafer according to claim 2, wherein
as the raw material silicon wafer, a silicon wafer with a resistivity of 0.1 Ωcm or less is used.

5. The method for producing a silicon wafer according to claim 4, wherein
the asker-C rubber hardness of the polishing pad used for the oxide-film surface is 50° or more but 70° or less.

6. The method for producing a silicon wafer according to claim 1, wherein
as the raw material silicon wafer, a silicon wafer with a resistivity of 0.1 Ωcm or less is used.

7. The method for producing a silicon wafer according to claim 6, wherein
the asker-C rubber hardness of the polishing pad used for the oxide-film surface is 50° or more but 70° or less.

8. The method for producing a silicon wafer according to claim 1, wherein
the asker-C rubber hardness of the polishing pad used for the oxide-film surface is 50° or more but 70° or less.

\* \* \* \* \*